United States Patent
Zang et al.

(10) Patent No.: US 10,914,873 B2
(45) Date of Patent: Feb. 9, 2021

(54) DISPLAY SUBSTRATE, PANEL, AND APPARATUS HAVING IRREGULAR EDGE PORTIONS WITH PARTIALLY COVERED PIXELS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Pengcheng Zang, Beijing (CN); Yang Wang, Beijing (CN); Ting Li, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/705,113

(22) Filed: Dec. 5, 2019

(65) Prior Publication Data

US 2020/0110200 A1    Apr. 9, 2020

Related U.S. Application Data

(63) Continuation-in-part of application No. 15/518,761, filed as application No. PCT/CN2016/088172 on Jul. 1, 2016, now abandoned.

(30) Foreign Application Priority Data

Feb. 2, 2016   (CN) .......................... 2016 1 0074558

(51) Int. Cl.
*G02B 5/00* (2006.01)
*H01L 27/12* (2006.01)

(52) U.S. Cl.
CPC ............ *G02B 5/003* (2013.01); *H01L 27/124* (2013.01)

(58) Field of Classification Search
CPC .............. H01L 27/322; H01L 51/0096; H01L 51/5281; H01L 27/124; G02B 5/003
See application file for complete search history.

(56) References Cited

U.S. PATENT DOCUMENTS

| | | | |
|---|---|---|---|
| 10,078,486 B2* | 9/2018 | Lee ...................... | G06F 3/1446 |
| 10,318,227 B2* | 6/2019 | Shin ..................... | G06F 3/1446 |
| 2009/0115933 A1* | 5/2009 | Mimura ............ | G02F 1/133606 349/59 |

(Continued)

OTHER PUBLICATIONS

Extended European Search Report (EESR) dated Sep. 11, 2019 in EP16838050.9.

*Primary Examiner* — Peter Bradford
(74) *Attorney, Agent, or Firm* — Syncoda LLC; Feng Ma

(57) ABSTRACT

A display substrate includes: a display region having an irregular edge portion; and a light-shielding area located around the display region; wherein: a pixel array is disposed in the display region; the pixel array includes outermost edge pixels of the irregular edge portion, and central pixel; each of the edge pixels includes at least one edge sub-pixel; each of the edge sub-pixels includes a light-shielding sub-region and a light-emitting sub-region arranged along a row direction; and the light-shielding sub-region is located at a side of each of the edge sub-pixels proximal to the light-shielding region.

20 Claims, 8 Drawing Sheets

(56) References Cited

U.S. PATENT DOCUMENTS

| | | | |
|---|---|---|---|
| 2009/0309813 A1* | 12/2009 | Fujita | G02F 1/133512 |
| | | | 345/55 |
| 2010/0013853 A1* | 1/2010 | Takatori | G02F 1/134336 |
| | | | 345/611 |
| 2010/0020277 A1* | 1/2010 | Morita | G02F 1/136209 |
| | | | 349/110 |
| 2010/0214195 A1 | 8/2010 | Ogasawara et al. | |
| 2010/0289994 A1 | 11/2010 | Nonaka | |
| 2015/0199930 A1* | 7/2015 | Sasaki | G09G 3/2007 |
| | | | 345/55 |
| 2016/0011476 A1* | 1/2016 | Park | G02F 1/134309 |
| | | | 349/47 |
| 2016/0120005 A1* | 4/2016 | Wu | H05B 33/145 |
| | | | 313/505 |
| 2016/0178940 A1* | 6/2016 | Yuan | G02F 1/133512 |
| | | | 359/893 |
| 2017/0125448 A1* | 5/2017 | Park | H01L 51/5284 |
| 2017/0278906 A1* | 9/2017 | Song | H01L 27/326 |
| 2017/0285421 A1* | 10/2017 | Tsuruma | H01L 29/78675 |

* cited by examiner

DISPLAY SUBSTRATE, PANEL, AND APPARATUS HAVING IRREGULAR EDGE PORTIONS WITH PARTIALLY COVERED PIXELS

CROSS-REFERENCE TO RELATED APPLICATIONS

The present application is continuation-in-part of, and claims priority to, U.S. patent application Ser. No. 15/518,761 filed on Apr. 12, 2017, which is a national stage entry of International Application No. PCT/CN2016/088172 filed on Jul. 1, 2016, which claims priority to Chinese Patent Application No. 201610074558.3 filed on Feb. 2, 2016. The disclosures of these applications are hereby incorporated by reference in their entirety.

BACKGROUND

With the rapid development of display technologies, there has been an increasingly high demands for display panels to adapt to different applications, prompting emergence of display panels with specialty designs. These display panels can have non-rectangular shapes, such as circular, semicircular, octagon, or other desired shapes. Some of the specialty display panels can be modified on the basis of conventional rectangular display panels, and configured to better adapt to the overall structure and environment of the buildings in which they are disposed. Currently, common display panels with special shapes may include fan-shaped, curved, circular, cylindrical, and triangular shaped display panels.

SUMMARY

The present disclosure relates generally to the field of display technology, and more specifically to a display substrate, a display panel, and a display apparatus.

In an aspect, a display substrate is provided, including:
a display region having an irregular edge portion; and
a light-shielding area located around the display region;
wherein:
a pixel array is disposed in the display region;
the pixel array includes outermost edge pixels of the irregular edge portion, and central pixel;
each of the edge pixels includes at least one edge sub-pixel;
each of the edge sub-pixels includes a light-shielding sub-region and a light-emitting sub-region arranged along a row direction; and
the light-shielding sub-region is located at a side of each of the edge sub-pixels proximal to the light-shielding region.

In some embodiments, the irregular edge portion includes:
at least one protruding area including a plurality of edge pixels located in a same row or a same column and arranged continuously;
wherein:
the protruding area has a corresponding aperture ratio gradation direction, and a plurality of edge pixels in the protruding area have gradually increasing aperture ratios along the corresponding aperture ratio gradation direction;
the aperture ratio gradation direction is a direction away from the light-shielding region in an arrangement direction of a plurality of edge pixels in the protruding area.

In some embodiments, an aperture ratio of an edge pixel is a ratio between an area of a light output subregion of all the edge sub-pixels included in the edge pixel, and an area of all the edge sub-pixels included in the edge pixel including the light output subregion and the light-shielding sub-region.

In some embodiments, a plurality of the edge pixels located in the same protruding area have gradually reducing sizes of the light-shielding sub-area included in the plurality of the edge pixels along the corresponding gradient direction of the aperture ratio.

In some embodiments, in the protruding area, a difference between aperture ratios of two edge pixels adjacent to each other in the corresponding aperture ratio gradation direction is a fixed value.

In some embodiments, in the protruding area, a difference between aperture ratios of two edge pixels adjacent to each other in the corresponding aperture ratio gradation direction has a linear or proportional variation.

In some embodiments:
each of the edge pixels includes a plurality of the edge sub-pixels having different colors;
area ratios between the light-shielding sub-regions and the light output region of each edge sub-pixel located in the same edge pixel are equal.

In some embodiments:
shapes and sizes of the light-shielding sub-regions of each of the edge sub-pixels located in the same edge pixel are the same;
shapes and sizes of the light output regions of the edge sub-pixels located in the same edge pixel are the same.

In some embodiments:
the display substrate further includes a plurality of gate lines and a plurality of data lines crossing each other;
the plurality of data lines have a polyline shape; and
a periphery of the edge sub-pixels is arranged with two gate line sub-segments and two data line sub-segments defining an area corresponding to the edge sub-pixel, wherein the two data line sub-segments have a preset polyline shape.

In some embodiments:
the light-shielding sub-region has an arrow shape; and
two opposing sides of the light-shielding sub-region in a row direction are parallel to the two data sub-segments.

In some embodiments, the display substrate further includes:
a black matrix located in a region where a plurality of the gate lines and a plurality of the data lines are located; and
a light-shielding sub-pattern located in the light-shielding sub-region, and the light-shielding sub-pattern is disposed at a same layer as the black matrix.

In some embodiments:
the light-shielding sub-pattern has a width along a row direction;
a width of the light-shielding sub-pattern at the light-shielding sub-regions included in the plurality of edge pixels located in the same protruding area gradually decreases along the corresponding direction of the aperture ratio gradation.

In some embodiments:
the edge sub-pixel is a multi-domain sub-pixel;
the preset polyline shape includes a plurality of sub-line segments; and each of the sub-line segments corresponds to a domain of the multi-domain sub-pixel.

In some embodiments:
the multi-domain sub-pixel is a dual-domain sub-pixel; and
the preset polyline shape includes two sub-line segments.

In another aspect, a display panel is provided, including: the display substrate described above; and a counter substrate opposing the display substrate.

In some embodiments, the counter substrate includes:

the display substrate further includes a plurality of gate lines and a plurality of data lines crossing each other;

wherein:

the plurality of data lines have a polyline shape; and a periphery of the edge sub-pixels is arranged with two gate line sub-segments and two data line sub-segments defining an area corresponding to the edge sub-pixel, wherein the two data line sub-segments have a preset polyline shape;

the light-shielding sub-region has an arrow shape; and two opposing sides of the light-shielding sub-region in a row direction are parallel to the two data sub-segments.

In some embodiments, the display substrate further includes:

a black matrix located in a region where a plurality of the gate lines and a plurality of the data lines are located;

a light-shielding sub-pattern located in the light-shielding sub-region, and the light-shielding sub-pattern is disposed at a same layer as the black matrix.

the light-shielding sub-pattern has a width along a row direction; and the width of the light-shielding sub-pattern at the light-shielding sub-regions included in the plurality of edge pixels located in the same protruding area gradually decreases along the corresponding direction of the aperture ratio gradation.

In some embodiments, the edge sub-pixel is a multi-domain sub-pixel, the preset polyline shape includes a plurality of sub-line segments, and each of the sub-line segments corresponds to a domain of the multi-domain sub-pixel.

In some embodiments, the multi-domain sub-pixel is a dual-domain sub-pixel, and the preset polyline shape includes two sub-line segments.

In another aspect, a display apparatus is provided, including: the display panel described above, a driver, and a power supply circuit.

Other embodiments and implementations may become apparent in view of the following description and drawings.

BRIEF DESCRIPTION OF THE DRAWINGS

To more clearly illustrate some of the embodiments, the following is a brief description of the drawings. The drawings in the following descriptions are only illustrative of some embodiments. For those of ordinary skill in the art, other drawings of other embodiments can become apparent based on these drawings.

DETAILED DESCRIPTION

In the following, with reference to the drawings of various embodiments disclosed herein, the technical solutions of the embodiments of the disclosure will be described in a clear and fully understandable way. It is noted that the described embodiments are merely a portion but not all of the embodiments of the disclosure. Based on the described embodiments of the disclosure, those ordinarily skilled in the art can obtain other embodiment(s), which come(s) within the scope sought for protection by the disclosure.

Figure 1:
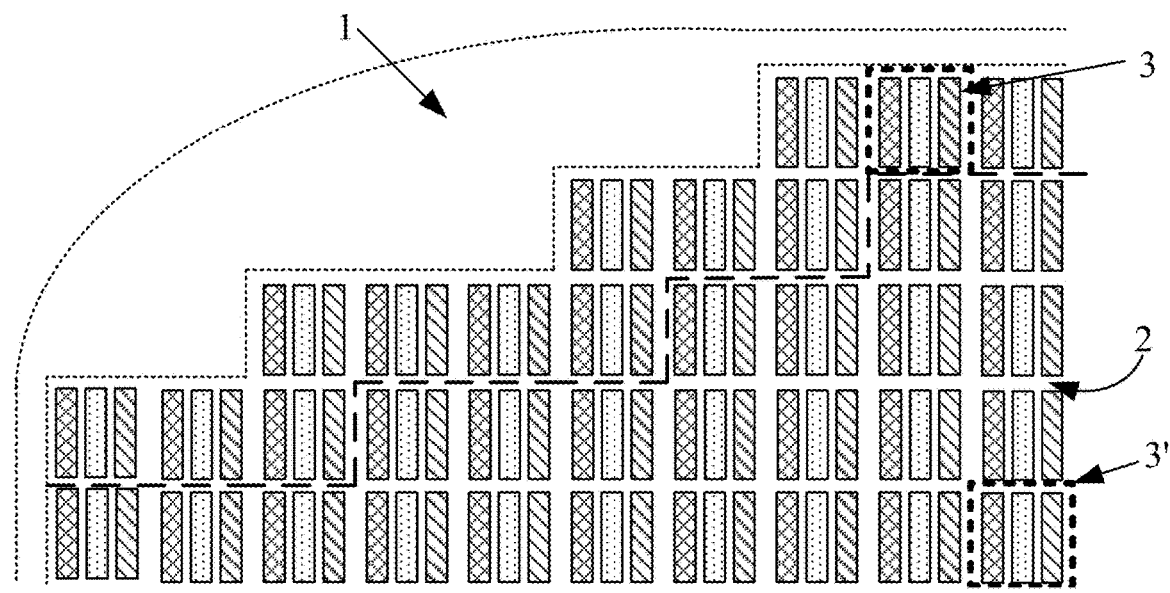
FIG. 1 is a schematic structural diagram of a special-shaped display panel involved in related technologies.

FIG. 1 is a schematic structural diagram of a special-shaped display panel involved in the related art.

As shown in FIG. 1, the special-shaped display panel includes a display region 2 having irregular edge portions and a light-shielding area 1 located around the display region 2. A pixel array composed of a plurality of pixels is provided in the display region 2, where the pixel array is divided into edge pixels 3 located on the outermost side and constituting an irregular edge portion and central pixels 3' located in the middle. For example, irregular edges of the irregular-shaped display panel include shapes such as an arc shape, a beveled edge, and a polyline shape.

A conventional pixel shape is usually designed as a rectangle. When forming irregular edges of a special-shaped display panel, it is necessary to arrange edge pixels 3 having the same size in a step arrangement. During display, there is a certain brightness difference between the edge pixels 3 and the light-shielding area 1, such that the edges of the display panel will show a sawtooth arrangement.

Especially when a plurality of consecutive edge pixels 3 are located in the same row or the same column, the row/column pixels and the adjacent row/column pixels will obviously protrude to show a stepped shape, that is, the edges of the display panel appear jagged, thereby the visual effect of the edge of the display panel is reduced, which seriously affects the user experience.

In order to solve or alleviate the above problems, various embodiments the present disclosure provide a display substrate.

Figure 2:
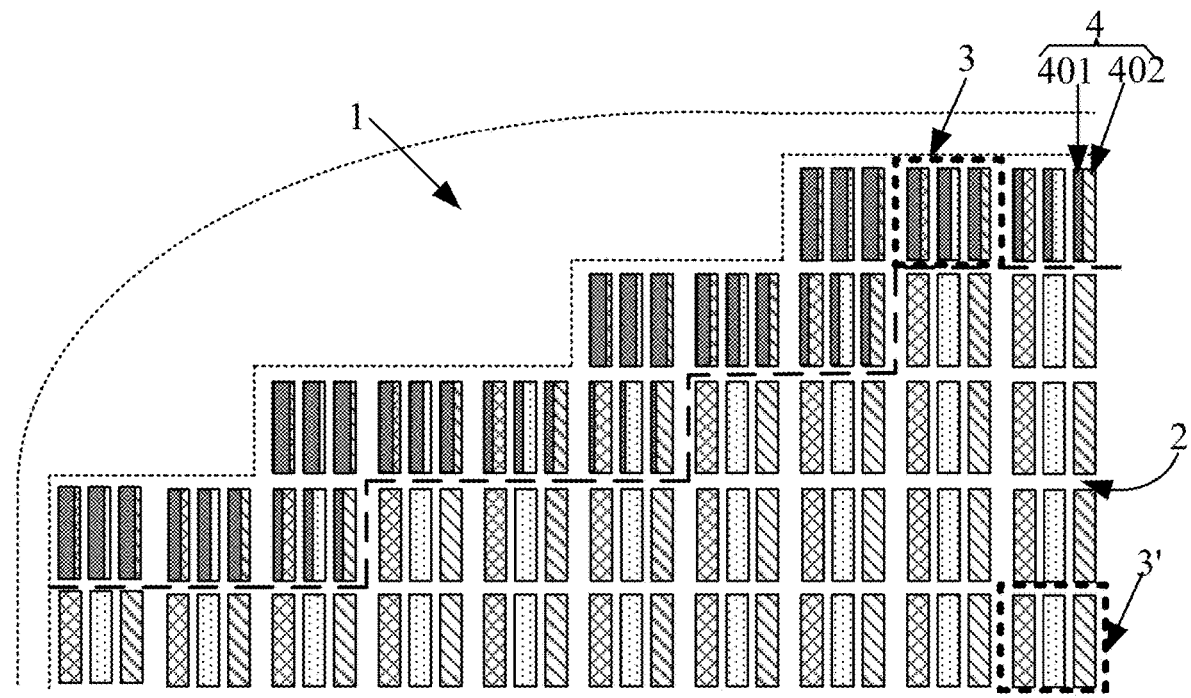
FIG. 2 is a schematic structural diagram of a display substrate according to some embodiments of the present disclosure.

FIG. 2 is a schematic structural diagram of a display substrate provided by some embodiments of the present disclosure. As shown in FIG. 2, the display substrate includes a display region 2 having irregular edge portions and a light-shielding region 1. A pixel array is disposed in the display region 2, and the pixel array includes edge pixels 3 located at the outermost side and constituting the irregular edge portion and the center pixels 3' located in the middle.

Each edge pixel 3 includes at least one edge sub-pixel 4, and each edge sub-pixel 4 includes a light-shielding sub-region 401 and a light-emitting sub-region 402 arranged along the row direction. The light-shielding sub-region 401 is located on a side of each edge sub-pixel 4 that is close to the light-shielding region 1.

Among them, the edge pixel 3 specifically includes a pixel that is in contact with the irregular edge, and further includes at least one of a plurality of pixels that are in contact with the irregular edge and arranged continuously on a side away from the light-shielding region 1. For example, one pixel, two pixels, or three pixels.

In some embodiments, as shown in FIG. 2, it includes one pixel extending along the arrangement direction of the plurality of edge pixels 3 and on the side facing away from the light-shielding region 1.

The "light-shielding sub-region 401" can refer to a region where light cannot pass through in a region corresponding to the edge sub-pixel 4. In some exemplary embodiments, the light-shielding sub-region 401 may be opaque by setting a light-shielding sub-pattern at the light-shielding sub-region 401. The "photon region 402" refers to a region through which light can pass in a region corresponding to the edge sub-pixel 4.

In some embodiments of the present disclosure, a light-shielding sub-region 401 is provided on a side of each edge sub-pixel 4 that is close to the light-shielding region 1 in the row direction, so that a plurality of edge pixels 3 adjacent to the irregular edge have gradually changing opening rate along the irregular edge, which can reduce the jagged feel.

In some embodiments, the irregular edge portion includes: at least one protruding area, the protruding area includes a plurality of edge pixels 3 located in the same row or the same column and arranged continuously; the convex area has a corresponding aperture ratio gradient direction. A plurality of edge pixels 3 in the protruding area gradually increase the aperture ratio along the direction of the corresponding aperture ratio gradient, which can reduce the jaggedness. The gradient direction of the aperture ratio is a direction away from the light-shielding region 1 in the arrangement direction of the plurality of edge pixels 3 in the protruding region.

The aperture ratio of an edge pixel 3 is equal to the ratio of the area of the photon sub-regions 402 of all the edge sub-pixels 4 to the sum of the areas of the photo-excitation sub-regions 402 of all the edge sub-pixels 4 and the light-shielding sub-regions 401.

Figure 3:
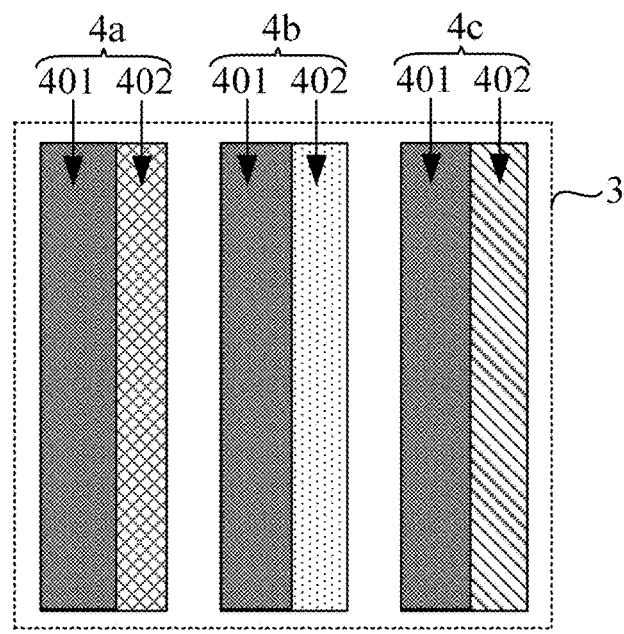
FIG. 3 is a schematic structural diagram of an edge pixel in FIG. 2.

FIG. 3 is a schematic structural diagram of an edge pixel in FIG. 2. As shown in FIG. 3, the edge pixel 3 includes three edge sub-pixels 4a, 4b, and 4c. The three edge sub-pixels 4a, 4b, and 4c have corresponding light-shielding sub-regions 401 and light-emitting sub-regions 402, respectively. Assuming the area of the light-shielding area 1 of each edge sub-pixel 4 is S1, S2, and S3, and the areas of the photon sub-regions 402 of the three edge sub-pixels 4 are S1', S2', and S3', respectively. The aperture ratio Q is equal to:

$$Q = \frac{S1' + S2' + S3'}{S1 + S2 + S3 + S1' + S2' + S3'}$$

In the above embodiments, the case where each edge pixel 3 includes 3 edge sub-pixels 4a, 4b, and 4c, and the edge sub-pixels 4a, 4b, and 4c are all rectangular, is merely exemplary, and does not limit the technical solution of the present disclosure. In the present disclosure, the number of edge sub-pixels included in each edge pixel 3 and the shape of each edge sub-pixel are not limited.

In some embodiments, each edge pixel 3 includes a plurality of edge sub-pixels 4 with different colors. The area ratio of the light-shielding sub-region 401 and the light-emitting sub-region 402 of each edge sub-pixel 4 within the same edge pixel 3 is equal or similar equal, which can effectively avoid the problem of color shift at the edge pixel 3. In some embodiments, each of the edge pixels 3 may include a red edge sub-pixel, a blue edge sub-pixel, and a green edge sub-pixel. Of course, according to design requirements, sub-pixels of other colors such as white-edge sub-pixels and/or yellow-edge sub-pixels may also be included.

In some embodiments, the shape and size of the light-shielding sub-regions 401 of each edge sub-pixel 4 located in the same edge pixel 3 are the same or approximately the same. The light-emitting sub-regions 402 of each edge sub-pixel 4 located in the same edge pixel 3 are all of the same or approximately the same shape or size. At this time, different edge sub-pixels 4 in the same edge pixel 3 may be prepared based on the same mask.

To better understand various embodiments of the present disclosure, description will be made below with reference to examples.

Figure 4:
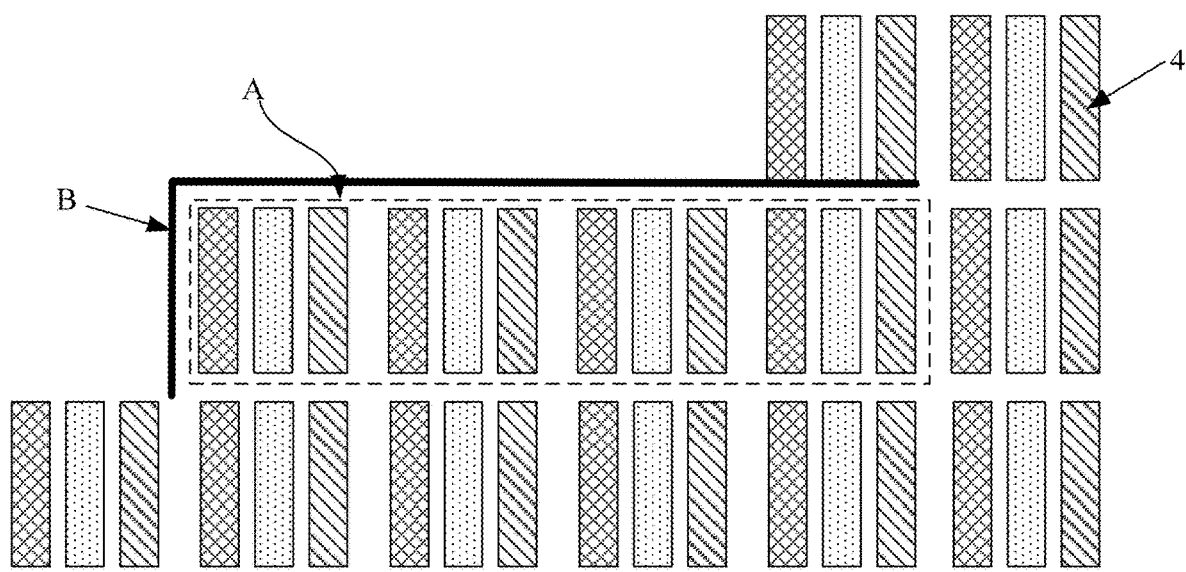
FIG. 4 is a schematic diagram of a plurality of edge pixels arranged in a same row and continuously arranged in the related art to form a protruding area.

FIG. 4 is a schematic diagram of a protruding region formed by a plurality of edge pixels arranged in the same row and continuously arranged in the related art.

As shown in FIG. 4, a plurality of edge pixels 3 located in the same row and arranged in a row will constitute a relatively large protruding step B (that is, a protruding area A). Since the protruding step B has a large size, it is easy to generate a jagged feel.

Figure 5:
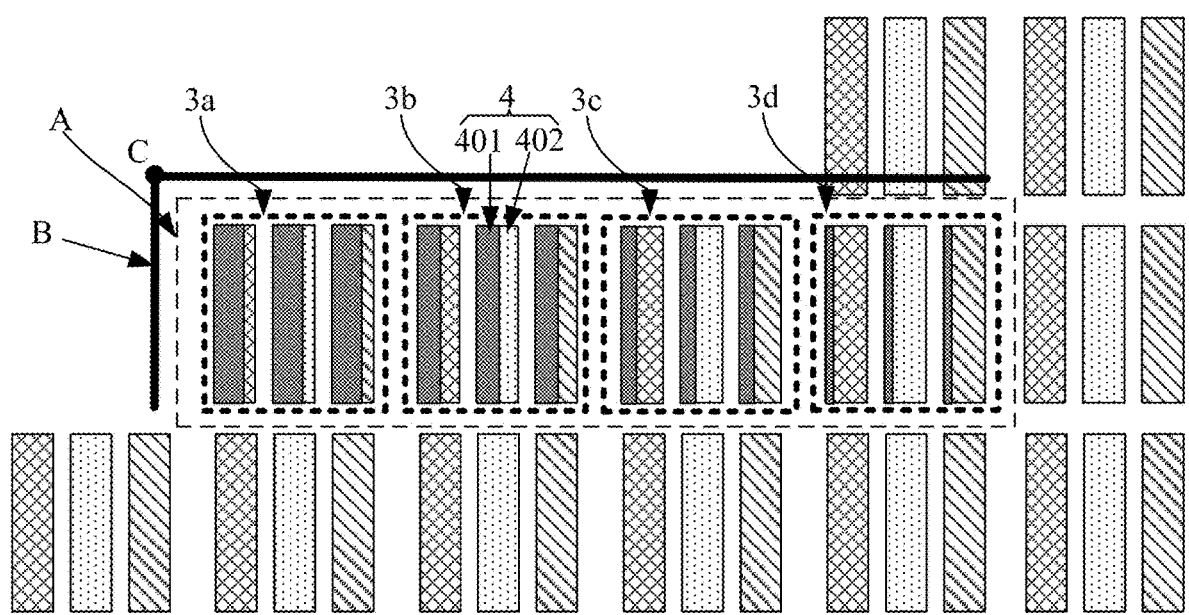
FIG. 5 is a schematic diagram of an improvement of the protruding region shown in FIG. 4 according to some embodiments of the present disclosure.

FIG. 5 is a schematic diagram of an improvement of the protruding region shown in FIG. 4, according to some embodiments of the present disclosure.

As shown in FIG. 5, the light-shielding sub-region 401 is arranged in the row direction of the edge sub-pixel 4 near the light-shielding region 1 (the left side in the edge sub-pixel 4 in the case shown in FIG. 5).

The plurality of edge pixels 3 in the protruding area A gradually increase the aperture ratio along the corresponding aperture ratio gradual direction (horizontal to the right in the case shown in FIG. 5), The visual brightness of the edge pixel 3 of the corner C closest to the protruding step in the protruding area A can be reduced.

The visual brightness of the edge pixel 3 in the protruding area A gradually increases along the direction of the corresponding aperture ratio gradation. That is, corresponding to the irregular edge portion, there is a smooth change in the user's visual brightness, so that the jagged feel can be reduced or even completely eliminated.

Continuing to refer to FIG. 5, the protruding area A includes four edge pixels 3, which are the first edge pixel 3a, the second edge pixel 3b, the third edge pixel 3c, and the fourth edge pixel 3d from left to right, respectively. The edge sub-pixels 4 included in the edge pixels 3a, 3b, 3c, and 3d are a first edge sub-pixel, a second edge sub-pixel, a third edge sub-pixel, and a fourth edge sub-pixel, respectively. That is, for the protruding area A, the visual brightness corresponding to the first edge pixel 3a, the second edge pixel 3b, the third edge pixel 3c, and the fourth edge pixel 3d sequentially increases, so that the jaggedness can be reduced or even completely eliminated.

In some embodiments, the size of the light-shielding sub-regions 401 included in the plurality of edge pixels 3 located in the same protruding area gradually decreases along the direction of the corresponding aperture ratio gradation. Taking the situation shown in FIG. 5 as an example, in the protruding area A, the size of the light-shielding sub-regions in the first edge sub-pixel, the second edge sub-pixel, the third edge sub-pixel, and the fourth edge sub-pixel gradually decreases.

In some embodiments, the difference between the aperture ratios of two edge pixels 3 adjacent to each other in the corresponding aperture ratio gradation direction in the protruding area is a fixed value.

Taking the situation shown in FIG. 5 as an example, the "two adjacent edge pixels" at this time specifically refer to two edge pixels directly adjacent in the horizontal right direction. For example, the first edge pixel 3a and the second edge pixel 3b are two adjacent edge pixels, the second edge pixel 3b and the third edge pixel 3c are two adjacent edge pixels, and the third edge pixel 3c and the fourth edge pixel 3d are two adjacent edge pixels. In the protruding area A, the difference between the aperture ratios of the first edge pixel 3a, the second edge pixel 3b, the third edge pixel 3c, and the fourth edge pixel 3d is a fixed value.

In some embodiments, the difference between the aperture ratios of two adjacent edge pixels 3 adjacent to each other in the corresponding aperture ratio gradation direction changes linearly or proportionally in the protruding area. Taking the case shown in FIG. 5 as an example, in the protruding area A, the differences of the aperture ratios of the first edge pixel 3a, the second edge pixel 3b, the third edge pixel 3c, and the fourth edge pixel 3d are changed linearly or proportionally.

In accordance with the embodiments described above, by setting the difference between the aperture ratios of two edge pixels 3 adjacent to each other in the direction of the corresponding aperture ratio gradation in the protruding area to a fixed value, making the difference show a linear change or a proportional change, the change in the visual brightness in the edge pixel 3 can be made smoother, which is beneficial to reducing the jagged feel.

Figure 6:
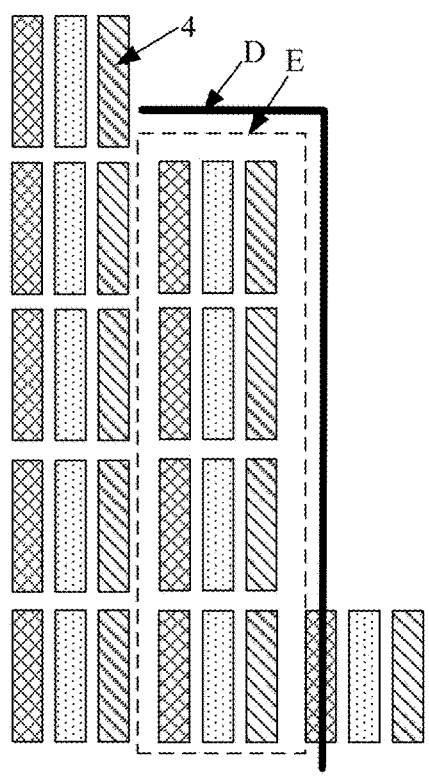
FIG. 6 is a schematic diagram of a protruding region formed by a plurality of edge pixels in the same column and continuously arranged in the related art.

FIG. 6 is a schematic diagram of a protruding region formed by a plurality of edge pixels arranged in the same column and continuously arranged in the related art.

As shown in FIG. 6, a plurality of edge pixels 3 located in the same row and arranged continuously will form a relatively large protruding step D (i.e., a protruding area E). Since the protruding step D has a large size, it is easy to produce a jagged feel.

Figure 7:
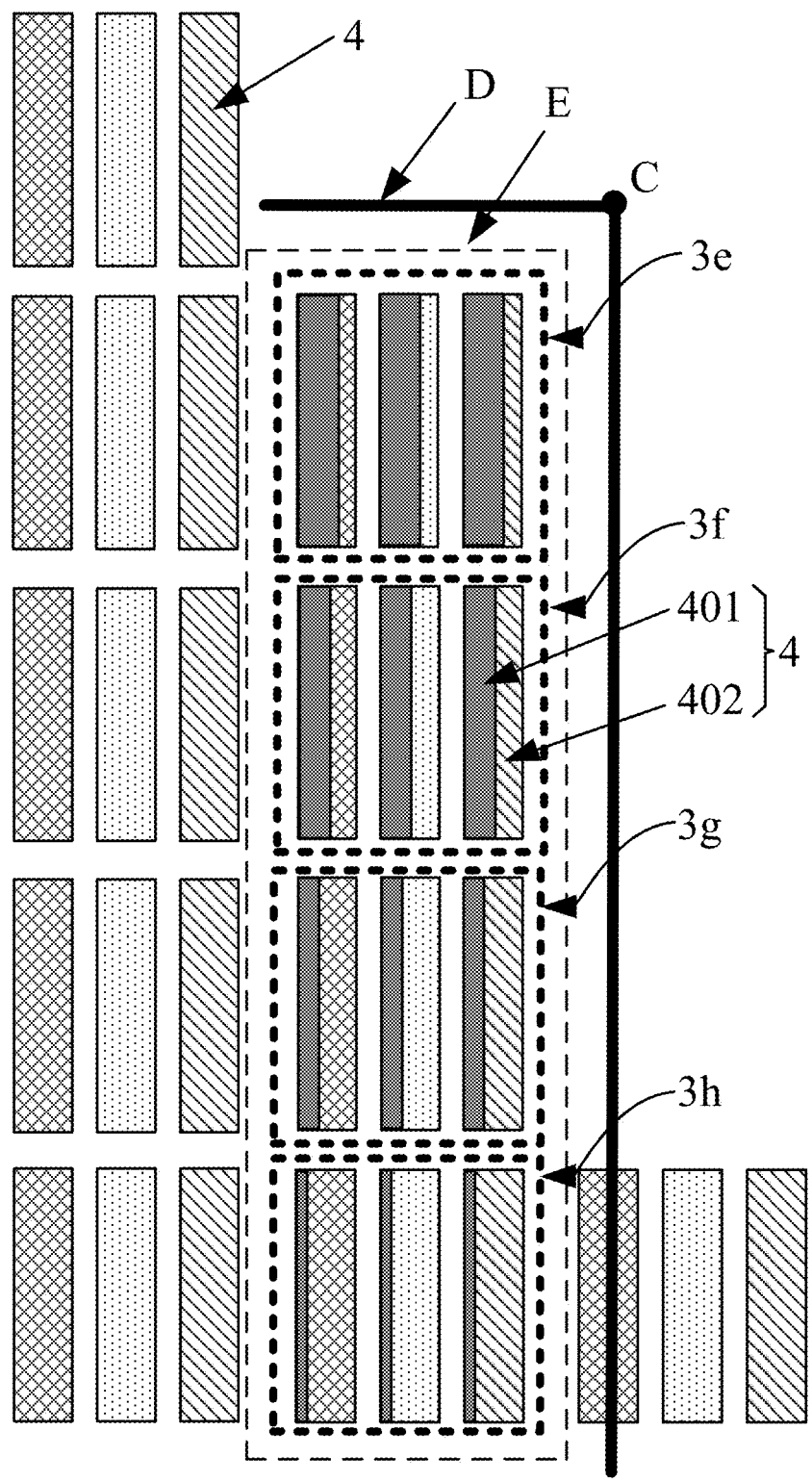
FIG. 7 is a schematic diagram of an improvement of the protruding area shown in FIG. 6 according to some embodiments of the present disclosure.

FIG. 7 is a schematic diagram of an improvement of the protruding region shown in FIG. 6 according to some embodiments of the present disclosure.

As shown in FIG. 7, the light-shielding sub-region 401 is arranged in the edge sub-pixel 4 near the light-shielding region 1 in the row direction (the right side in the edge sub-pixel 4 in the case shown in FIG. 7).

In the protruding region E, a plurality of edge pixels 3 along the direction of a gradual increase of the corresponding aperture ratio (vertical downward in the case shown in FIG. 7) gradually increases the aperture ratio, which can make the visual brightness of the edge pixel 3 of the corner C closest to the protruding step D in the protruding area E decrease.

The visual brightness of the edge pixel 3 is gradually increased in the protruding area E in the corresponding aperture ratio gradient direction, that is, the visual brightness felt by the user corresponding to the irregular edge part has a smooth change to reduce or even completely eliminate jaggedness.

Continuing to refer to FIG. 7, the protruding area E includes four edge pixels 3, which are a fifth edge pixel 3e, a sixth edge pixel 3f, a seventh edge pixel 3g, and an eighth edge pixel 3h from top to bottom, respectively. The edge sub-pixels 4 included in the edge pixels 3e, 3f, 3g, and 3h are a fifth edge sub-pixel, a sixth edge sub-pixel, a seventh edge sub-pixel, and an eighth edge sub-pixel, respectively. That is, for the protruding area E, the visual brightness corresponding to the fifth edge pixel 3e, the sixth edge pixel 3f, the seventh edge pixel 3g, and the eighth edge pixel 3g sequentially increases, so that the jagged feel can be reduced or even completely eliminated.

In some embodiments, the size of the light-shielding sub-regions 401 included in the plurality of edge pixels 3 located in the same protruding area gradually decreases along the direction of the corresponding aperture ratio gradation. Taking the case shown in FIG. 7 as an example, in the protruding area E, the size of the light-shielding sub-region in the fifth edge sub-pixel, the sixth edge sub-pixel, the seventh edge sub-pixel, and the eighth edge sub-pixel is gradually reduced.

In some embodiments, the difference between the aperture ratios of two edge pixels 3 adjacent to each other in the corresponding aperture ratio gradation direction in the convex area is a fixed value. Taking the situation shown in FIG. 7 as an example, the "adjacent two edge pixels" at this time specifically refers to the two edge pixels directly adjacent in the vertical downward direction. For example, the fifth edge pixel 3e and the sixth edge pixel 3f are two adjacent edge pixels, the sixth edge pixel 3f and the seventh edge pixel 3g are two adjacent edge pixels, and the seventh edge pixel 3g and the eighth edge pixel 3h are two adjacent edge pixels. In the protruding area E, the difference between the aperture ratios of the fifth edge pixel 3e, the sixth edge pixel 3f, the seventh edge pixel 3g, and the eighth edge pixel 3h is a fixed value.

In some embodiments, the difference between the aperture ratios of two adjacent edge pixels 3 adjacent to each other in the corresponding aperture ratio gradation direction changes linearly or proportionally in the protruding area. Taking the situation shown in FIG. 7 as an example, in the protruding area E, the difference between the aperture ratios of the fifth edge pixel 3e, the sixth edge pixel 3f, the seventh edge pixel 3g, and the eighth edge pixel 3h varies linearly or proportionally.

Figure 8:
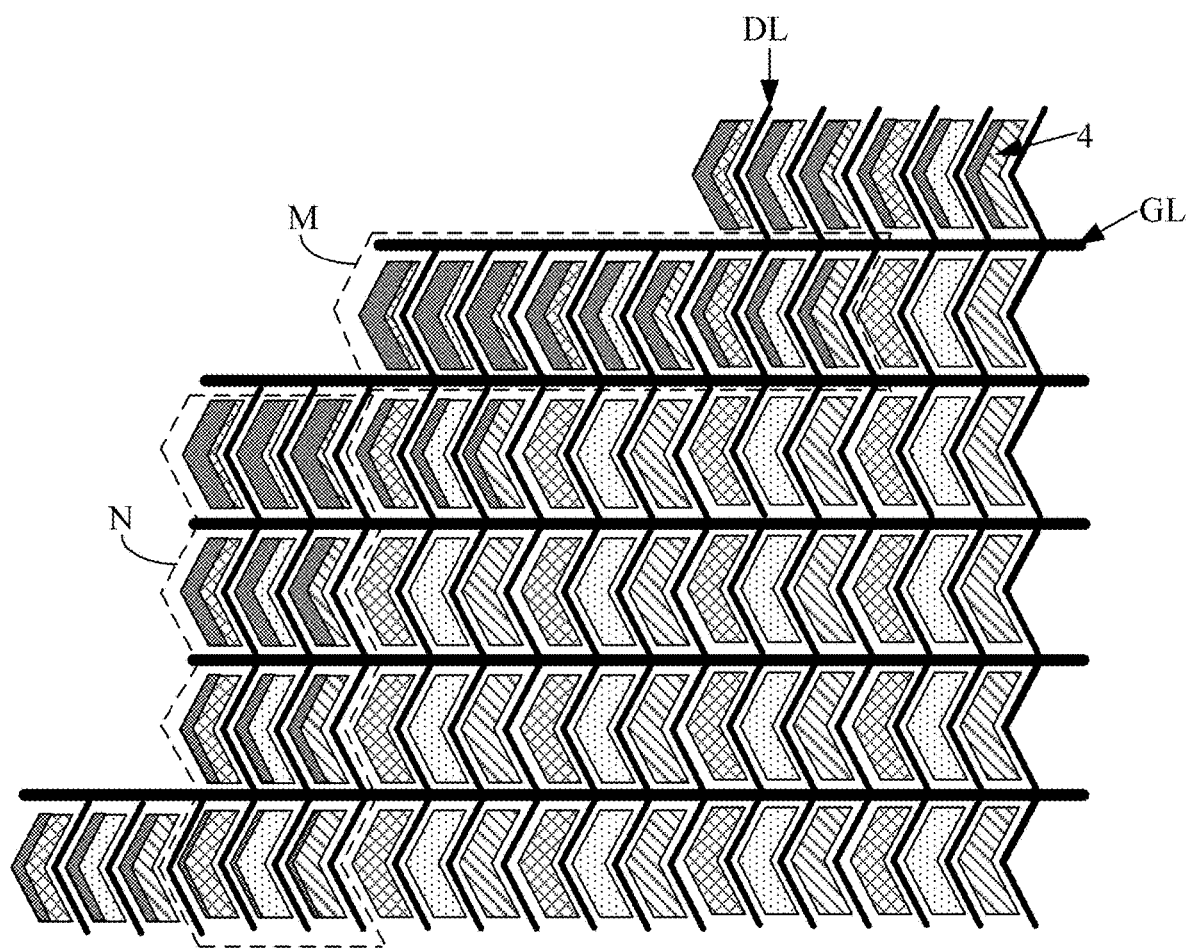
FIG. 8 is a schematic structural diagram of another display substrate according to some embodiments of the present disclosure.

FIG. 8 is a schematic structural diagram of another display substrate according to some embodiments of the present disclosure.

Figure 9:
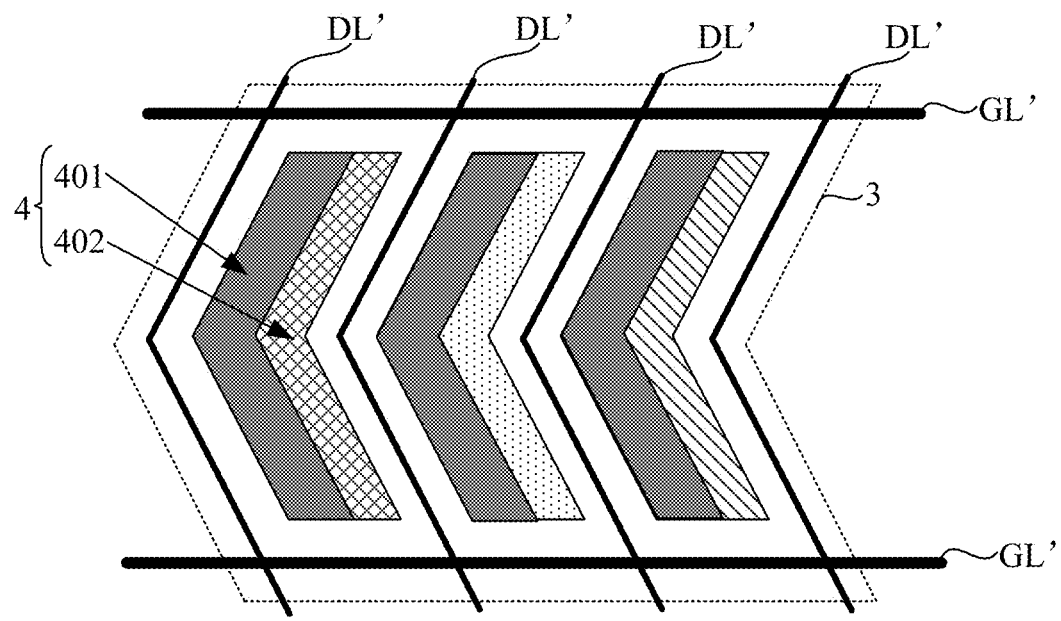
FIG. 9 is a schematic structural diagram of an edge pixel in FIG. 8.

FIG. 9 is a schematic structural diagram of an edge pixel 3 in FIG. 8.

Figure 10:
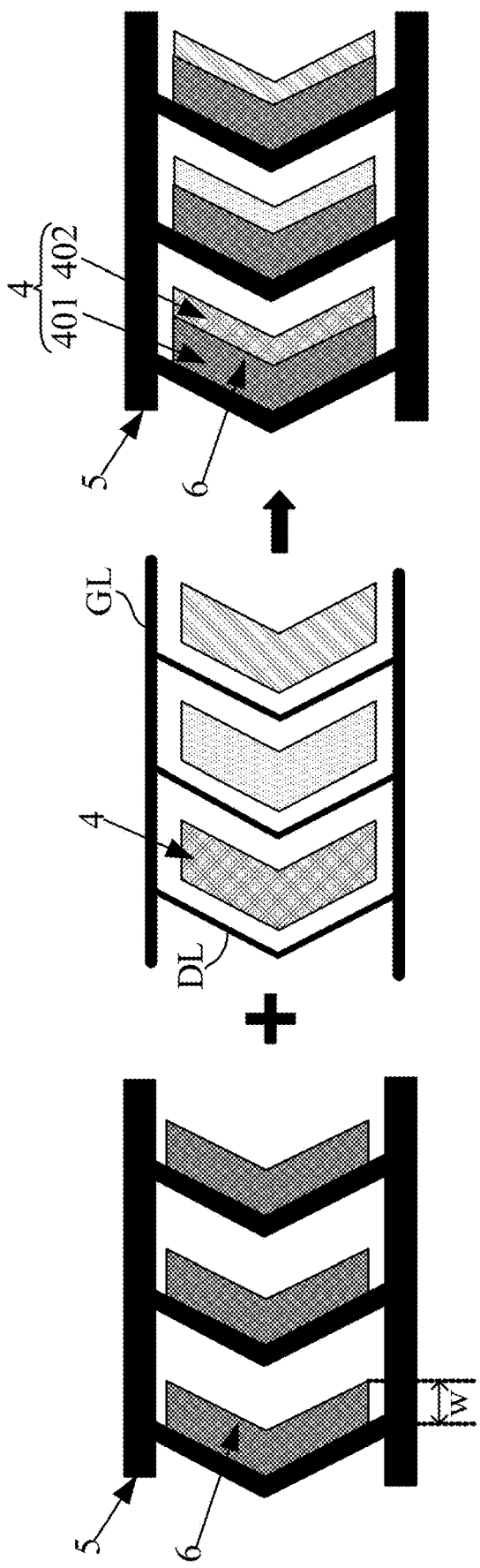
FIG. 10 is a schematic diagram of a black matrix and a light-shielding sub-pattern covering gate lines, data lines, and edge sub-pixels.

FIG. 10 is a schematic diagram when a black matrix and a light-shielding sub-pattern cover gate lines, data lines, and edge sub-pixels.

As shown in FIG. 8 to FIG. 10, different from the embodiments shown in FIG. 2, the display substrate in this embodiment further includes a plurality of gate lines (GL) and a plurality of data lines (Data Lines, DL). The data line DL has a polygonal line shape. Two grid line sub-segments GL' and two data line sub-segments DL' are defined around the edge sub-pixel 4 to define a region corresponding to the edge sub-pixel 4. The segment DL' has a preset polyline shape, for example, it is a polyline segment. The area corresponding to the edge sub-pixel 4 defined by the two gate line sub-segments GL' and the two data line sub-segments DL' is not rectangular.

In some embodiments, the edge sub-pixel 4 is a multi-domain sub-pixel, and the preset polygonal shape includes a plurality of sub-line segments, and each sub-line segment corresponds to one domain of the multi-domain sub-pixel.

As shown in FIG. 8, the multi-domain sub-pixel is a dual-domain sub-pixel, and the preset polygonal shape includes two sub-line segments. At this time, the data line sub-segment is in the shape of "<" or ">", and the area corresponding to the edge sub-pixel 4 defined by the data line sub-segment DL 'and the grid line sub-segment GL' is arrow-shaped.

Among them, FIG. 8 only exemplarily illustrates a case where the data line sub-segments are in a "<" shape. Of course, the multi-domain sub-pixel in the present disclosure may also be a three-domain sub-pixel, a four-domain sub-pixel, or more domain sub-pixels.

In some embodiments, the light-shielding sub-pattern 6 has an arrow shape, and two opposite sides of the light-shielding sub-pattern 6 opposite in the row direction are parallel to the data sub-segment DL'. At this time, the light-shielding sub-region 401 and the light-exiting sub-region 402 both have an arrow shape.

In some embodiments, the display substrate further includes: a black matrix 5 located in a region where the plurality of gate lines GL and a plurality of data lines DL are located; and a light-shielding sub-pattern 6 located in the light-shielding sub-region 401.

In some embodiments, the light-shielding sub-pattern 6 is disposed on the same layer as the black matrix 5. At this time, the light-shielding sub-pattern 6 and the black matrix 5 can be prepared at the same time based on the same patterning process by improving the existing mask used for preparing the black matrix 5 pattern correspondingly without additional steps. The light-shielding sub-pattern 6 and the black matrix 5 may be made of the same material. Also, the light shielding sub-pattern 6 and the black matrix 5 can have the same thickness.

In some embodiments, the light-shielding sub-pattern 6 has a width w along the row direction. In the light-shielding sub-area 401 of a plurality of edge pixels 3 located in the same protruding area, along the corresponding aperture ratio gradient direction, the width w of the pattern 6 gradually decreases.

Figure 11:
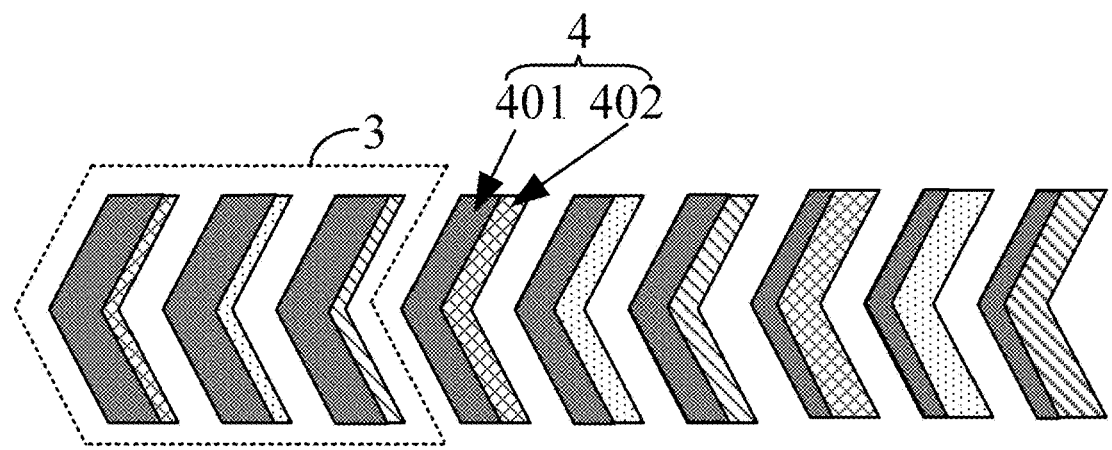
FIG. 11 is an enlarged schematic diagram of a protruding area M in FIG. 8.

FIG. 11 is an enlarged schematic diagram of the protruding region M in FIG. 8.

As shown in FIG. 11, the direction of the gradation of the aperture ratio corresponding to the protruding area M is horizontal to the right; in the protruding area M, the side in the edge sub-pixel 4 that is close to the light-shielding region 1 in the row direction is the left side in the edge sub-pixel 4.

Figure 12:
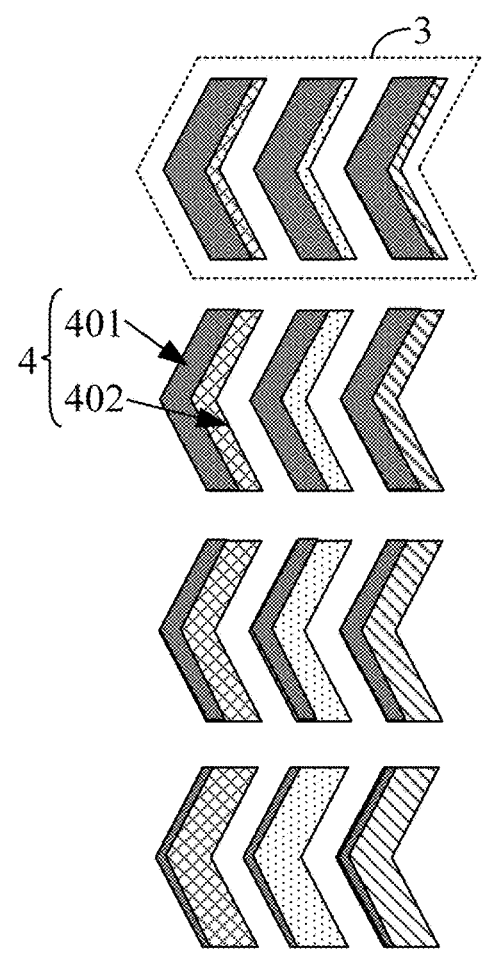
FIG. 12 is an enlarged schematic diagram of the protruding area N in FIG. 8.

FIG. 12 is an enlarged schematic diagram of the protruding area N in FIG. 8.

As shown in FIG. 12, the direction of the gradation of the aperture ratio corresponding to the protruding area N is a vertical downward direction. In the protruding area N, the side of the edge sub-pixel 4 that is closer to the light-shielding area 1 in the row direction is the left side in the edge sub-pixel 4.

Various embodiments of the present disclosure further provide a display panel including the display substrate provided by any one of the foregoing embodiments and an opposite substrate disposed opposing the display substrate. In some embodiments of the present disclosure, the display substrate can be a color filter substrate, and the opposite substrate is an array substrate; or, the display substrate is a color filter on array (COA) substrate, and the opposite substrate is a box substrate or a package cover.

In some embodiments, the display substrate is a color filter substrate, and the opposite substrate is an array substrate; at this time, the opposite substrate includes: a plurality of gate lines and a plurality of data lines arranged in a crosswise manner. The data lines have a polygonal line shape. Around the edge sub-pixel, two grid line sub-segments and two data line sub-segments for defining an area corresponding to the edge sub-pixel are provided. The data line sub-segments have a preset polyline shape (for example, a polyline line segment).

In some embodiments, the light-shielding sub-region has an arrow shape, and two opposite sides of the light-shielding sub-region in the row direction are parallel to the data sub-segments.

In some embodiments, the display substrate further includes: a black matrix located in a region where a plurality of gate lines and a plurality of data lines are located. The light-shielding sub-pattern is located in the light-shielding sub-region, and the light-shielding sub-pattern is arranged on the same layer as the black matrix.

In some embodiments, the light-shielding sub-pattern has a width along the row direction. A plurality of edge pixels located in the same protruding area. The width of the light-shielding sub-pattern at the light-shielding sub-region contained in these edge pixels decreases along the corresponding aperture ratio gradation direction.

In some embodiments, the edge sub-pixel is a multi-domain sub-pixel, and the preset polygonal shape includes a plurality of sub-line segments, and each sub-line segment corresponds to one domain of the multi-domain sub-pixel.

In some embodiments, the multi-domain sub-pixel is a dual-domain sub-pixel, and the preset polyline shape includes two sub-line segments.

For specific descriptions of the gate lines, data lines, light-shielding sub-regions, light-shielding sub-patterns, and black matrix, refer to the corresponding content in the foregoing embodiments, and details are not described herein again.

In a case that the display substrate is a color filter substrate and the opposite substrate is an array substrate, the light-shielding sub-pattern and the black matrix are located on the color filter substrate, and the gate lines and a plurality of data lines are located on the array substrate. When the display substrate is a color film array integrated substrate and the opposite substrate is a box substrate or a package cover, the light shielding sub-pattern, black matrix, grid lines, and data lines are all located on the color film array integrated substrate.

Various embodiments of the present disclosure also provide a display apparatus including the display panel provided in the foregoing embodiments, a driver, and a power supply circuit. In some embodiments, the driver may be an integrated circuit chip for providing a display signal to a display panel. In some embodiments, the power supply circuit may be a circuit structure for supplying power to the display panel and the driver. The display apparatus in the present disclosure may be any device including the above-mentioned special-shaped display panel, including but not limited to, displays for cellular mobile phones, tablet computers, computers, displays used in smart wearable devices, and display apparatuses used in vehicles such as automobiles.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A display substrate comprising:
a display region having an irregular edge portion; and
a light-shielding area located around the display region;
wherein:
a pixel array is disposed in the display region;
the pixel array includes a plurality of edge pixels about the irregular edge portion, and one or more central pixels;
each of the plurality of edge pixels includes a plurality of edge sub-pixels;
each of the plurality of edge sub-pixels about the irregular edge portion has a first side longer than a second side, and includes only one light-shielding sub-region and only one light-emitting sub-region arranged along a row direction, each light-shielding sub-region being asymmetric with respect to its associated edge sub-pixel, each light-shielding sub-region occupying, in a two-dimensional surface of the pixel array, only the first side completely; and
the light-shielding sub-region is located at a side of each of the plurality of edge sub-pixels proximal to the light-shielding region.

2. The display substrate according to claim 1, wherein the irregular edge portion comprises:
at least one protruding area comprising multiple edge pixels located in a same row or a same column and arranged continuously;
wherein:
the protruding area has a corresponding aperture ratio gradation direction, and the multiple edge pixels in the protruding area have gradually increasing aperture ratios along the corresponding aperture ratio gradation direction; and
the aperture ratio gradation direction is a direction away from the light-shielding region in an arrangement direction of the multiple edge pixels in the protruding area.

3. The display substrate according to claim 2, wherein:
an aperture ratio of an edge pixel is a ratio between an area of a light output sub-region of all of the plurality of edge sub-pixels included in the edge pixel; and
an area of all of the plurality of edge sub-pixels included in the edge pixel including the light output sub-region and the light-shielding sub-region.

4. The display substrate according to claim 2, wherein:
multiple edge pixels located in the same protruding area have gradually reducing sizes of the light-shielding sub-area included in the multiple edge pixels along the corresponding gradient direction of the aperture ratio.

5. The display substrate according to claim 2, wherein:
in the protruding area, a difference between aperture ratios of two edge pixels adjacent to each other in the corresponding aperture ratio gradation direction is a fixed value.

6. The display substrate according to claim 2, wherein:
in the protruding area, a difference between aperture ratios of two edge pixels adjacent to each other in the corresponding aperture ratio gradation direction has a linear or proportional variation.

7. The display substrate according to claim 2,
wherein:
each of the plurality of edge pixels includes the plurality of edge sub-pixels having different colors; and
area ratios between the light-shielding sub-regions and the light output region of each of the plurality of edge sub-pixels located in the same edge pixel are equal.

8. The display substrate according to claim 7,
wherein:
shapes and sizes of the light-shielding sub-regions of each of the plurality of edge sub-pixels located in the same edge pixel are the same; and
shapes and sizes of the light output regions of the plurality of edge sub-pixels located in the same edge pixel are the same.

9. The display substrate according to claim 2,
wherein:
the display substrate further comprises a plurality of gate lines and a plurality of data lines crossing each other;
the plurality of data lines being provided having a multi-lineal shape, the multiple lines forming the multi-lineal shape intersecting at non-right angles; and
a periphery of the plurality of edge sub-pixels is arranged with two gate line sub-segments and two data line sub-segments defining an area corresponding to the plurality of edge sub-pixels, wherein the two data line sub-segments have a preset multi-lineal shape.

10. The display substrate according to claim 9,
wherein:
the light-shielding sub-region has an arrow shape; and
two opposing sides of the light-shielding sub-region in a row direction are parallel to the two data sub-segments.

11. The display substrate according to claim 9, further comprising:
a black matrix located in a region where a plurality of the gate lines and a plurality of the data lines are located; and
a light-shielding sub-pattern located in the light-shielding sub-region, and the light-shielding sub-pattern is disposed at a same layer as the black matrix.

12. The display substrate according to claim 11,
wherein:
the light-shielding sub-pattern has a width along a row direction; and
a width of the light-shielding sub-pattern at the light-shielding sub-regions included in the multiple edge pixels located in the same protruding area gradually decreases along the corresponding direction of the aperture ratio gradation.

13. The display substrate according to claim 11,
wherein:
the preset multi-lineal shape includes a plurality of sub-line segments; and each of the plurality of sub-line segments corresponds to a domain of the multi-domain sub-pixel.

14. The display substrate according to claim 13,
wherein:
the sub-pixel includes a light-shielding portion and a light-emitting portion; and
the preset multi-lineal shape includes two sub-line segments.

15. A display panel, comprising:
the display substrate according to claim 1; and
a counter substrate opposing the display substrate.

16. The display panel according to claim 15, wherein the counter substrate comprises:
a plurality of gate lines and a plurality of data lines crossing each other;

wherein:
the plurality of data lines have a multi-lineal shape;
a periphery of the plurality of edge sub-pixels is arranged with two gate line sub-segments and two data line sub-segments defining an area corresponding to the plurality of edge sub-pixels, wherein the two data line sub-segments have a preset multi-lineal shape;
the light-shielding sub-region has an arrow shape; and
two opposing sides of the light-shielding sub-region in a row direction are parallel to the two data sub-segments.

17. The display panel according to claim 16, wherein the display substrate further comprises:
a black matrix located in a region where a plurality of the gate lines and a plurality of the data lines are located; and
a light-shielding sub-pattern located in the light-shielding sub-region;
wherein:
the light-shielding sub-pattern is disposed at a same layer as the black matrix;
the light-shielding sub-pattern has a width along a row direction; and
the width of the light-shielding sub-pattern at the light-shielding sub-regions included in the multiple edge pixels located in the same protruding area gradually decreases along the corresponding direction of the aperture ratio gradation.

18. The display panel according to claim 16, wherein:
each of the plurality of edge sub-pixels is a multi-domain sub-pixel;
the preset multi-lineal shape includes a plurality of sub-line segments; and
each of the plurality of sub-line segments corresponds to a domain of the multi-domain sub-pixel.

19. The display panel according to claim 18, wherein:
the multi-domain sub-pixel is a dual-domain sub-pixel; and
the preset multi-lineal shape includes two sub-line segments.

20. A display apparatus, comprising:
the display panel according to claim 19;
a driver; and
a power supply circuit.

\* \* \* \* \*